United States Patent
Shibata et al.

(10) Patent No.: US 9,722,588 B1
(45) Date of Patent: Aug. 1, 2017

(54) APPARATUSES AND METHODS FOR DETECTING FREQUENCY RANGES CORRESPONDING TO SIGNAL DELAYS OF CONDUCTIVE VIAS

(71) Applicant: Micron Technology, Inc., Boise, ID (US)

(72) Inventors: Tomoyuki Shibata, Kokubunji (JP); Minehiko Uehara, Komae (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/138,042

(22) Filed: Apr. 25, 2016

(51) Int. Cl.
| | | |
|---|---|---|
| H03B 19/00 | (2006.01) | |
| H03K 5/14 | (2014.01) | |
| H01L 23/48 | (2006.01) | |
| H01L 23/528 | (2006.01) | |
| H01L 25/065 | (2006.01) | |
| H01L 25/18 | (2006.01) | |
| G11C 5/02 | (2006.01) | |
| G11C 5/06 | (2006.01) | |
| G11C 8/18 | (2006.01) | |
| G11C 7/10 | (2006.01) | |
| H03K 5/24 | (2006.01) | |
| H03K 5/156 | (2006.01) | |

(52) U.S. Cl.
CPC .............. *H03K 5/14* (2013.01); *G11C 5/025* (2013.01); *G11C 5/06* (2013.01); *G11C 7/1087* (2013.01); *G11C 8/18* (2013.01); *H01L 23/481* (2013.01); *H01L 23/528* (2013.01); *H01L 25/0657* (2013.01); *H01L 25/18* (2013.01); *H03K 5/1565* (2013.01); *H03K 5/24* (2013.01); *H01L 2225/06541* (2013.01)

(58) Field of Classification Search
None
See application file for complete search history.

(56) References Cited

U.S. PATENT DOCUMENTS

| | | | |
|---|---|---|---|
| 8,237,228 B2* | 8/2012 | Or-Bach | ............... G03F 9/7076 257/369 |
| 8,273,610 B2* | 9/2012 | Or-Bach | ............. H01L 21/6835 257/E23.101 |

(Continued)

FOREIGN PATENT DOCUMENTS

JP    2015-179380 A1    10/2015

*Primary Examiner* — Lincoln Donovan
*Assistant Examiner* — Khareem E Almo
(74) *Attorney, Agent, or Firm* — Dorsey & Whitney LLP

(57) ABSTRACT

Apparatuses for monitoring a signal on a conductive via are described. An example apparatus includes: a controller, a first conductive via, a second conductive via and an evaluation circuit. The controller provides a clock signal as a first signal. The first conductive via provides a second signal responsive to the first signal. The second conductive via provides a third signal responsive to the second signal. Responsive to the third signal, the evaluation circuit provides an evaluation result signal. The evaluation result signal is indicative of a frequency of the clock signal, based on a delay of the third signal relative to the clock signal. The first conductive via, the second conductive via and the evaluation circuit may be included in an interface die. The evaluation circuit may detect whether a frequency of the first signal is below a first threshold frequency and may further provide the evaluation result signal.

20 Claims, 15 Drawing Sheets

(56) References Cited

U.S. PATENT DOCUMENTS

| | | | |
|---|---|---|---|
| 8,362,482 B2 * | 1/2013 | Or-Bach | H01L 21/6835 257/103 |
| 8,557,632 B1 * | 10/2013 | Or-Bach | H01L 27/088 257/E21.499 |
| 8,754,533 B2 * | 6/2014 | Or-Bach | H01L 21/76254 257/777 |
| 9,000,557 B2 * | 4/2015 | Or-Bach | H01L 21/8221 257/506 |
| 9,411,015 B2 * | 8/2016 | Yokou | G01R 31/3187 |

* cited by examiner

APPARATUSES AND METHODS FOR DETECTING FREQUENCY RANGES CORRESPONDING TO SIGNAL DELAYS OF CONDUCTIVE VIAS

BACKGROUND

High data reliability, high speed of memory access, lower power consumption and reduced chip size are features that are demanded from semiconductor memory. In recent years, three-dimensional (3D) memory devices, such as High Bandwidth Memory (HBM), with considerably smaller footprints have been introduced. Some 3D memory devices are formed by stacking dies vertically and interconnecting the dies using through-silicon vias (TSVs) between an interface (I/F) die and core dies as shown in FIG. 1A. The TSVs in the 3D memory devices reduce circuit delays and power consumption due to long signal lines in a non-3D memory device. A large number of TSVs in the 3D memory devices between layers allow wide bandwidth buses between functional blocks in different layers. Thus, the 3D memory devices contribute to higher memory access speed, lower power consumption and chip size reduction.

FIG. 1B is a cross-sectional view of a structure of TSVs in the HBM in FIG. 1A. As shown in FIG. 1B, a TSV 1 in an interface chip 2 is through silicon substrate layers 3 and wiring layers 7. An insulating ring 4 surrounds the TSV 1. The TSV 1 is insulated from an internal circuit 6 formed at least in part in a transistor region 5 in the silicon substrate layers 3 and wiring layers 7. Thereby, capacitance between the TSV 1 the silicon substrate layers 3 is reduced. A surface bump 9 is disposed at an end of the TSV 1 on a side of a core chip 8 of the silicon substrate layers 3. The surface bump 9 may be an electrode that contacts a surface bump 10 provided in a core chip 8. For example, the surface bump 9 is coupled to a plurality of pads 11 through the TSV 1. The plurality of pads 11 may be formed in the wiring layers 7. A through-hole electrode 12 may couple the plurality of pads 11 to each other in the wiring layers 7. Further, the plurality of pads 11 is coupled to the internal circuit 6 through internal wiring lines (not shown in the drawings).

A TSV in HBM may have a parasitic resistance and a parasitic capacitance, which may cause a delay of a signal between an I/F die and a core die transmitted through the TSV. Particularly, capacitance of the TSV may be frequency dependent and effective capacitance (Ceff) of the TSV may appear to be different, depending on a frequency of the signal. FIG. 2A is a graph showing a capacitance-voltage (CV) characteristics curve showing relationships between a voltage of the TSV ($V_{TSV}$) and capacitance of the TSV ($C_{TSV}$) in a p-type Si substrate. A horizontal axis represents the voltage of the TSV ($V_{TSV}$) and a vertical axis represents the capacitance of the TSV ($C_{TSV}$). A signal represented as the voltage of the TSV ($V_{TSV}$) swings between two voltages +V and −V. When the signal level is negative, the CV characteristics curve is in an accumulation phase and the capacitance of the TSV ($C_{TSV}$) is about capacitance of an oxide-semiconductor interface (Cox) per area. In a depletion phase, the capacitance of the TSV ($C_{TSV}$) decreases as a more positive voltage ($V_{TSV}$) is applied on the TSV. In an inversion phase, the effective capacitance (Ceff) of the TSV varies based on a frequency of the signal. For example, the capacitance of TSV ($C_{TSV}$) increases to Cox if the frequency of the signal transmitted through the TSV is low due to that holes and electrons in the p-type Si substrate inverts its substrate type responsive to gate signals and electron accumulation. On the other hand, the capacitance of TSV ($C_{TSV}$) may stay depleted, smaller than Cox, if the frequency of the signal transmitted through the TSV is high.

FIG. 2B is a graph showing capacitance-frequency characteristics showing relationships between a frequency of a signal transmitted by a TSV ($F_{TSV}$) and effective capacitance of the TSV (Ceff) in an inversion phase. A horizontal axis represents the frequency of the signal transmitted by the TSV ($F_{TSV}$) and a vertical axis represents the effective capacitance of the TSV (Ceff). As shown in FIG. 2B, the effective capacitance of the TSV (Ceff) becomes smaller as the frequency of the TSV ($F_{TSV}$) becomes higher, while the frequency of the signal is between a first threshold frequency (FREQ1_INV) and a second threshold frequency (FREQ2_INV). For example, the effective capacitance of the TSV (Ceff) is stable around 1.5e-13F when the signal has a frequency ($F_{TSV}$) lower than the first threshold frequency (FREQ1_INV). The effective capacitance of the TSV (Ceff) starts dropping when the frequency $F_{TSV}$ becomes higher than the first threshold frequency (FREQ1_INV). If the signal has the frequency $F_{TSV}$ higher than the second threshold frequency (FREQ2_INV), the effective capacitance of the TSV (Ceff) becomes stable. As a result, a signal having a low frequency, particularly lower than the first threshold frequency (FREQ1_INV) may have a longer delay in transmission through a TSV due to higher effective capacitance (Ceff) than a signal having a high frequency.

FIG. 3 is a timing diagram of sets of a clock signal, a control signal (command signal) and an address/data signal through a TSV on a transmitter side and on a receiver side. The timing diagram is based on the signals transmitted from a transmitter side (e.g., the interface die) to a receiver side (e.g., the core die). A horizontal axis represents a time and a vertical axis represents a signal level (e.g., logic high, logic low). The clock signal is set to a logic high level and to a logic low level alternatively every half cycle the clock signal. The control signal and the address/data signal may be set to a logic high level or a logic low level, depending on the signal levels to be transmitted every cycle. Thus, a frequency of the clock signal is twice or more than the frequencies of the control signal and the address/data signal. A TSV transmitting the clock signal CKtx from the transmitter side to the receiver side as the clock signal CKrx may have a smaller effective capacitance (Ceff), if the frequency of the clock signal is high enough to cause small effective capacitance (Ceff) of the TSV. On the other hand, a TSV transmitting the control signal CTRLtx from the transmitter side to the receiver side as the control signal CTRLrx may have a larger effective capacitance (Ceff) because of having a frequency that is half or less than the frequency of the clock signal. Similarly, a TSV transmitting the address/data signal ADDtx/DATAtx from the transmitter side to the receiver side as the control signal ADDrx/DATArx may have a larger effective capacitance (Ceff) because of having a frequency that is half or less than the frequency of the clock signal. Due to the smaller effective capacitance (Ceff) of the TSV for the clock signal, a clock signal CKrx may have shorter delay. At the same time, the larger effective capacitance (Ceff) of the TSVs for the control signal and the address/data signal, the control signal CTRLrx and the address/data signal ADDrx/DATArx may have longer delays. The above finding is a result experimentally observed by the inventors. The inconsistent delays across signals due to different signal frequencies may cause transmission errors.

DETAILED DESCRIPTION OF PREFERRED EMBODIMENTS

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 1A:
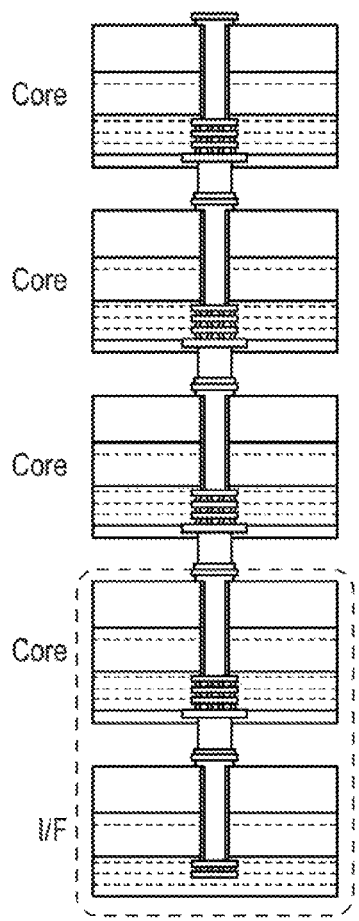
FIG. 1A is a schematic diagram of an interface (I/F) die and a plurality of core dies of HBM in a semiconductor device.
Figure 1B:
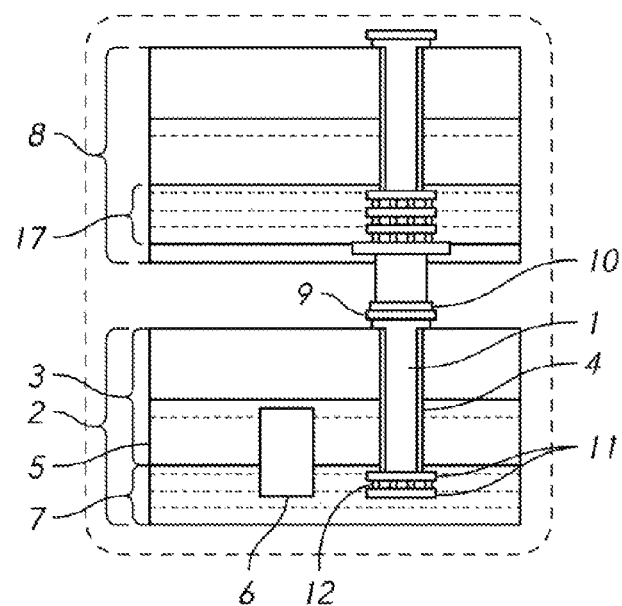
FIG. 1B is a cross-sectional view of a structure of TSVs in the HBM in FIG. 1A.
Figure 2B:
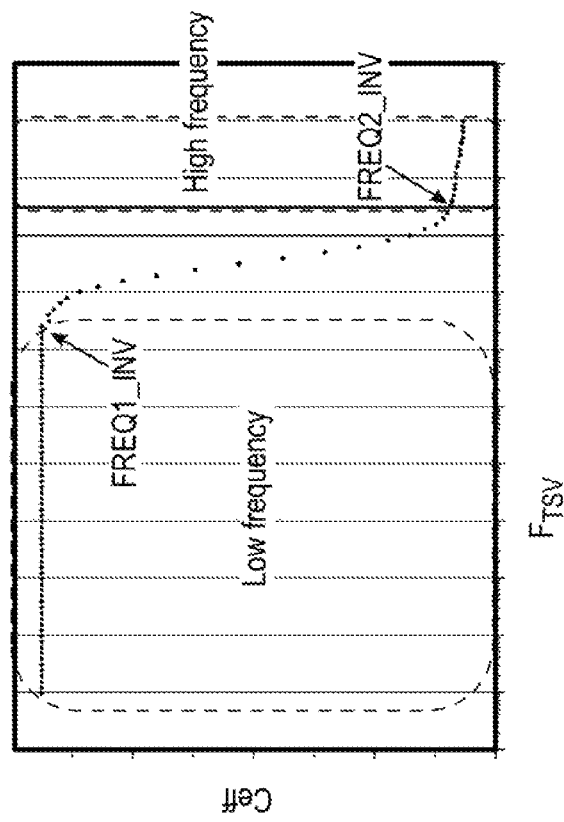
FIG. 2B is a graph showing capacitance-frequency characteristics showing relationships between a frequency of the TSV ($F_{TSV}$) and effective capacitance of a TSV (Ceff) in an inversion phase.
Figure 2A:
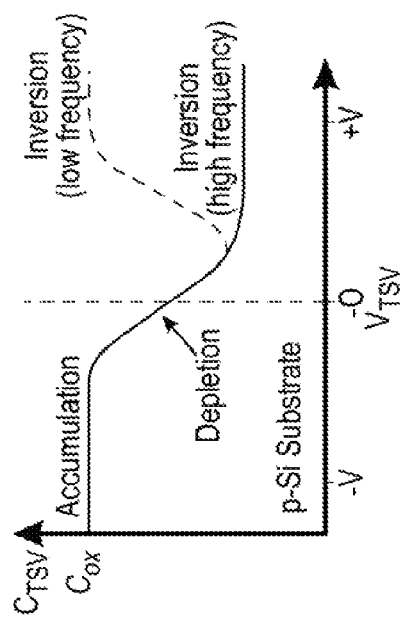
FIG. 2A is a graph showing a capacitance-voltage (CV) characteristics curve showing relationships between a voltage of the TSV ($V_{TSV}$) and capacitance of a TSV ($C_{TSV}$) in a p-type Si substrate.
Figure 3:
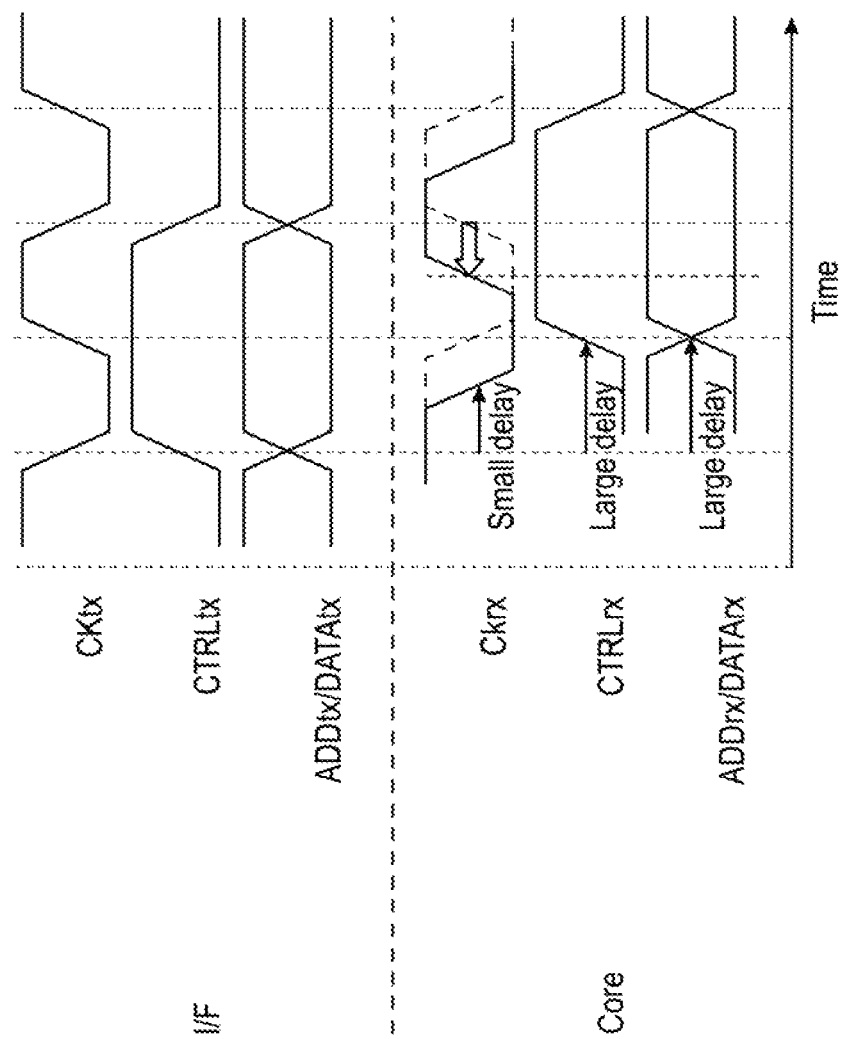
FIG. 3 is a timing diagram of sets of a clock signal, a control signal and an address/data signal through a TSV on an transmitter side and on a receiver side.
Figure 4A:
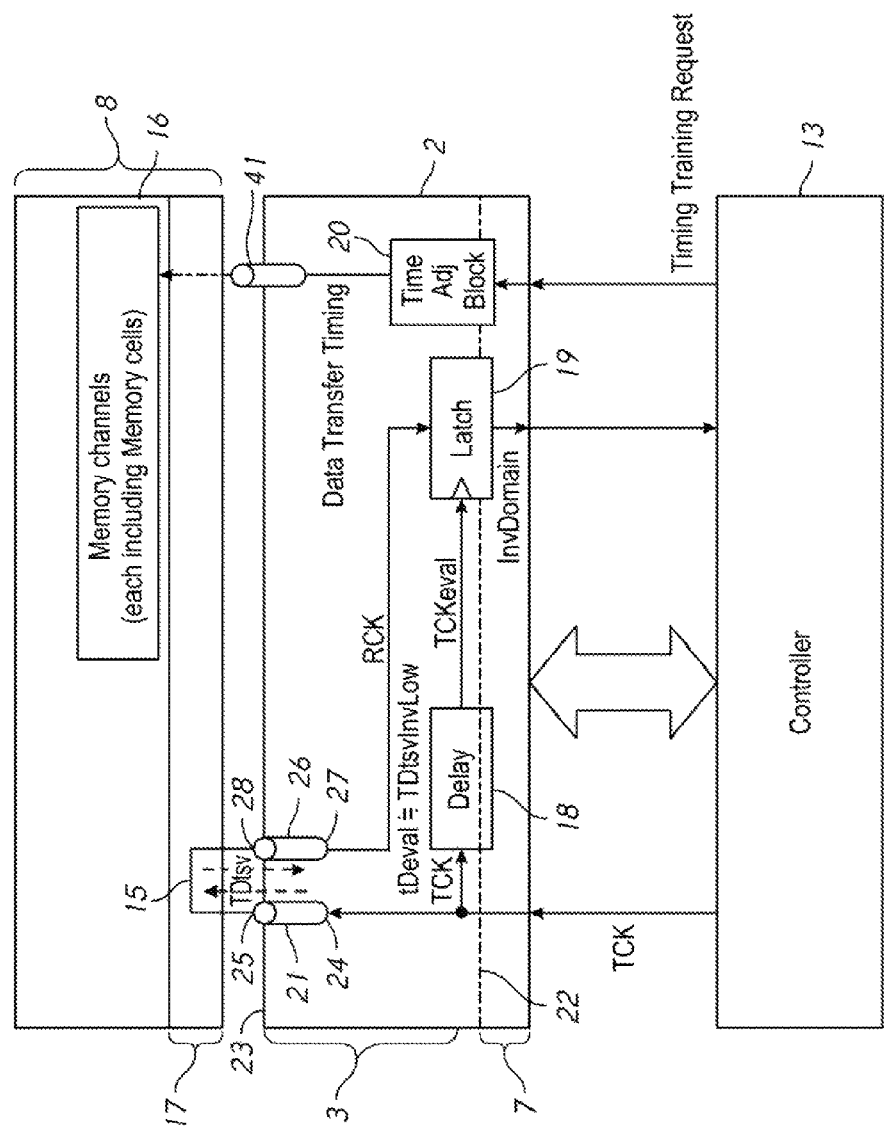
FIG. 4A is a block diagram of an apparatus in a semiconductor device including a conductive via, in accordance with an embodiment of the present disclosure.

FIG. 4A is a block diagram of an apparatus in a semiconductor device including a conductive via in accordance with an embodiment of the present disclosure. The semiconductor device may include an interface (I/F) die 2 and at least one core die 8. A conductive via 21 for transmitting a signal is provided on the I/F die 2. A semiconductor substrate 3, which is a substrate layer of the I/F die 2 has a first main surface 22 and a second main surface 23. The conductive via 21 penetrates the semiconductor substrate 3. The conductive via 21 may also penetrate wiring layers 7 as well. The conductive via 21 has a first end 24 on a side of the first main surface 22 and a second end 25 on a side of the second main surface 23. The conductive via 21 may receive a first signal at the first end 24. The first signal may be a clock signal (TCK) for signal transmission through the conductive via 21. The conductive via 21 may then provide a second signal from the second end 25. Thus, the conductive via 21 may transmit a signal (e.g., a clock signal) from the I/F die 2 to the at least one core die 8. A conductive via 26 for receiving a signal may also be provided on the I/F die 2. The conductive via 26 penetrates the semiconductor substrate 3. The conductive via 26 may also penetrate wiring layers 7 as well. The conductive via 26 has a third end 27 on a side of the first main surface 22 and a fourth end 28 on a side of the second main surface 23. The fourth end of the conductive via 26 is coupled to the second end 25 of the conductive via 21 by a signal line 15 in wiring layers 17 of the core die 8. The conductive via 26 may receive a fourth signal (e.g., the second signal from the conductive via 21) at the fourth end 28 coupled to the core die 8 and further may provide a third signal from the third end 27. The third signal may be a received clock signal (RCK). Thus, the conductive via 26 may transmit a signal (e.g., a clock signal) from the core die 8 to the I/F die 2.

Figures 4B, 4C:
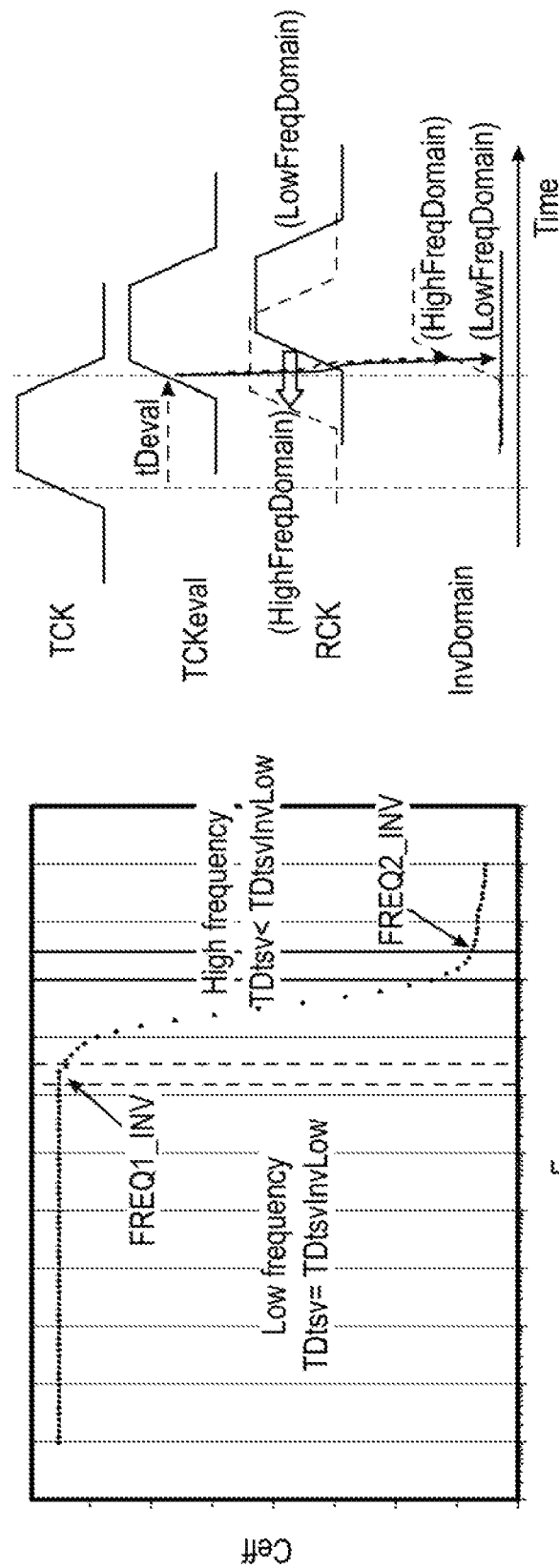
FIG. 4B is a graph showing capacitance-frequency characteristics showing relationships between a frequency of the TSV and effective capacitance of a TSV in an inversion phase, in accordance with an embodiment of the present disclosure.
FIG. 4C is a timing diagram of sets of clock signals, an evaluation reference clock signal and an evaluation result signal, in accordance with an embodiment of the present disclosure.

The third signal (RCK) may have a propagation delay (TDtsv) relative to the first signal (TCK) caused by the effective capacitance (Ceff) of a combination of the conductive via 21 and the conductive via 26. For example, a delay circuit 18 and a latch circuit 19 may be located across the substrate layer 3 and the wiring layer 7 of the I/F die 2. The delay circuit 18 and the latch circuit 19 detects whether the propagation delay (TDtsv) is caused by a signal with a high frequency or by a signal with a low frequency. FIG. 4B is a graph showing capacitance-frequency characteristics showing relationships between a frequency of a signal transmitted by the TSV ($F_{TSV}$) and effective capacitance of a TSV (Ceff)

in an inversion phase, in accordance with an embodiment of the present disclosure. A horizontal axis represents the frequency of the signal transmitted by the TSV ($F_{TSV}$) and a vertical axis represents the effective capacitance of the TSV (Ceff). The delay circuit 18 receives the first signal (TCK), delays the first signal by an evaluation reference delay (tDeval) and provides a first delayed signal as an evaluation reference clock signal (TCKeval). The evaluation reference delay (tDeval) may be set to a propagation delay (TDtsvInvLow) which may model the effective capacitance (Ceff) of a combination of the conductive via 21 and the conductive via 26 when the first signal has a frequency lower than the first threshold frequency (FREQ1_INV) in an inversion phase. The latch circuit 19 receives the first delayed signal (TCKeval) and the third signal (RCK). The latch circuit 19 latches the third signal responsive to the first delayed signal and provides an evaluation result signal (InvDomain) which is indicative of a detected frequency range, such as a domain below the first threshold frequency (FREQ1_INV) or a domain above the first threshold frequency (FREQ1_INV) in the inversion phase as shown in FIG. 4B. Thus, a combination of the delay circuit 18 and the latch circuit 19 represent an evaluation circuit configured to evaluate the third signal with regards to the first signal and providing the evaluation result signal.

FIG. 4C shows a timing diagram of sets of the clock signals (TCK and RCK), the evaluation reference clock signal (TCKeval) and the evaluation result signal (InvDomain), in accordance with an embodiment of the present disclosure. A horizontal axis represents a time and a vertical axis represents a signal level (e.g., logic high, logic low). Signals based on the first signals in the high frequency range and the low frequency range are represented in dotted lines and solid lines, respectively, for the received clock signal (RCK) and the evaluation result signal (InvDomain). As described above, the evaluation reference clock signal (TCKeval) has a delay relative to the first signal (TCK) of the evaluation reference delay (tDeval). The propagation delay (TDtsv) of the third signal (RCK) is substantially the same as or longer than the evaluation reference delay (tDeval). The propagation delay (TDtsv) of the third signal (RCK) is caused by large effective capacitance (Ceff) of the combination of the conductive via 21 and the conductive via 26. The evaluation reference delay (tDeval) is the propagation delay (TDtsvInvLow), if the first signal (TCK) has a frequency lower than the first threshold frequency (FREQ1_INV). Thus, the latch circuit 19 provides the evaluation result signal (InvDomain) which is the third signal (RCK) still inactive, for example, at a time the first delayed signal (TCKeval) latches the third signal (RCK). On the other hand, the propagation delay (TDtsv) of the third signal (RCK) may be shorter than the evaluation reference delay (tDeval), if the first signal (TCK) has a frequency higher than the first threshold frequency (FREQ1_INV). The propagation delay (TDtsv) of the third signal (RCK) is caused by the small effective capacitance (Ceff) of the combination of the conductive via 21 and the conductive via 26. Thus, the latch circuit 19 provides the evaluation result signal (InvDomain) that is the third signal (RCK) already active, for example, at the time the first delayed signal (TCKeval) latches the third signal (RCK). As described above, it is possible to detect whether the clock signal (TCK) has a high frequency by monitoring the evaluation result signal (InvDomain) and the propagation delay TDtsv can be estimated for further delay compensation.

For example, the controller 13 may receive the evaluation result signal. The controller 13 may periodically monitor or check the status (e.g., a logic level) of the evaluation result signal (InvDomain). If the controller 13 detects the change of the level of the evaluation result signal (InvDomain), the controller 13 provides a timing training request to the I/F die 2. The I/F die 2 may include a time adjustment block 20 which may be an adjustment circuit or an adjustment controller performing an adjustment function to perform the timing training to adjust a timing of data transfer between the I/F die 2 and the core dies 8 through the TSVs upon the timing training request. For example, when the first clock (TCK) is a low frequency, the time adjustment block 20 provides a data transfer timing signal to a conductive via 41 to set a data transfer timing between the core die 8 and the I/F die 2 into a timing suitable to the low frequency. For example, a plurality of TSVs may be provided for data transfer (not shown) between the core dies 8 and the I/F die 2. The core dies 8 may include a plurality of buffers coupled to one ends of the plurality of TSVs for data transfer, which can adjust data latch and transfer timing based on the data transfer timing signal transmitted via the conductive via 41. The I/F die 2 may also include a plurality of buffers coupled to the other ends of the plurality of TSVs for the data transfer, which can adjust data latch and transfer timing based on the data transfer timing signal output from the time adjustment block 20. The controller 13 periodically checks the level of the evaluation result signal (InvDomain) and maintains the timing suitable to the low frequency as long as it detects the logic low level of the evaluation result signal (InvDomain). If the controller 13 increases a frequency of the first signal (TCK) and the latch 19 provides the logic high level of the evaluation result signal (InvDomain) when the frequency of the first signal (TCK) is beyond a threshold as shown in FIG. 4B, the controller 13 detects the logic high level of the evaluation result signal (InvDomain). Responsive to the detected logic high level of the evaluation result signal (InvDomain), the controller 13 provides a timing training request to the time adjustment block 20 on the I/F die 2. Upon the timing training request, the time adjustment block 20 performs the timing training and sets the data transfer timing between the core die 8 and the I/F die 2 into a timing suitable to the high frequency. The controller 13 can also cause the time adjustment block 20 to perform the timing training to adjust a timing therebetween when the level of the evaluation result signal (InvDomain) switches from the high level to the low level. By this time adjustment, the timing margin for data transfer of the semiconductor device may be increased. For example, a memory device having stacked memory dies coupled to each other by TSVs can be operated by clock signals of a wide range of clock frequencies for TSV signal transmission.

Figure 5A:
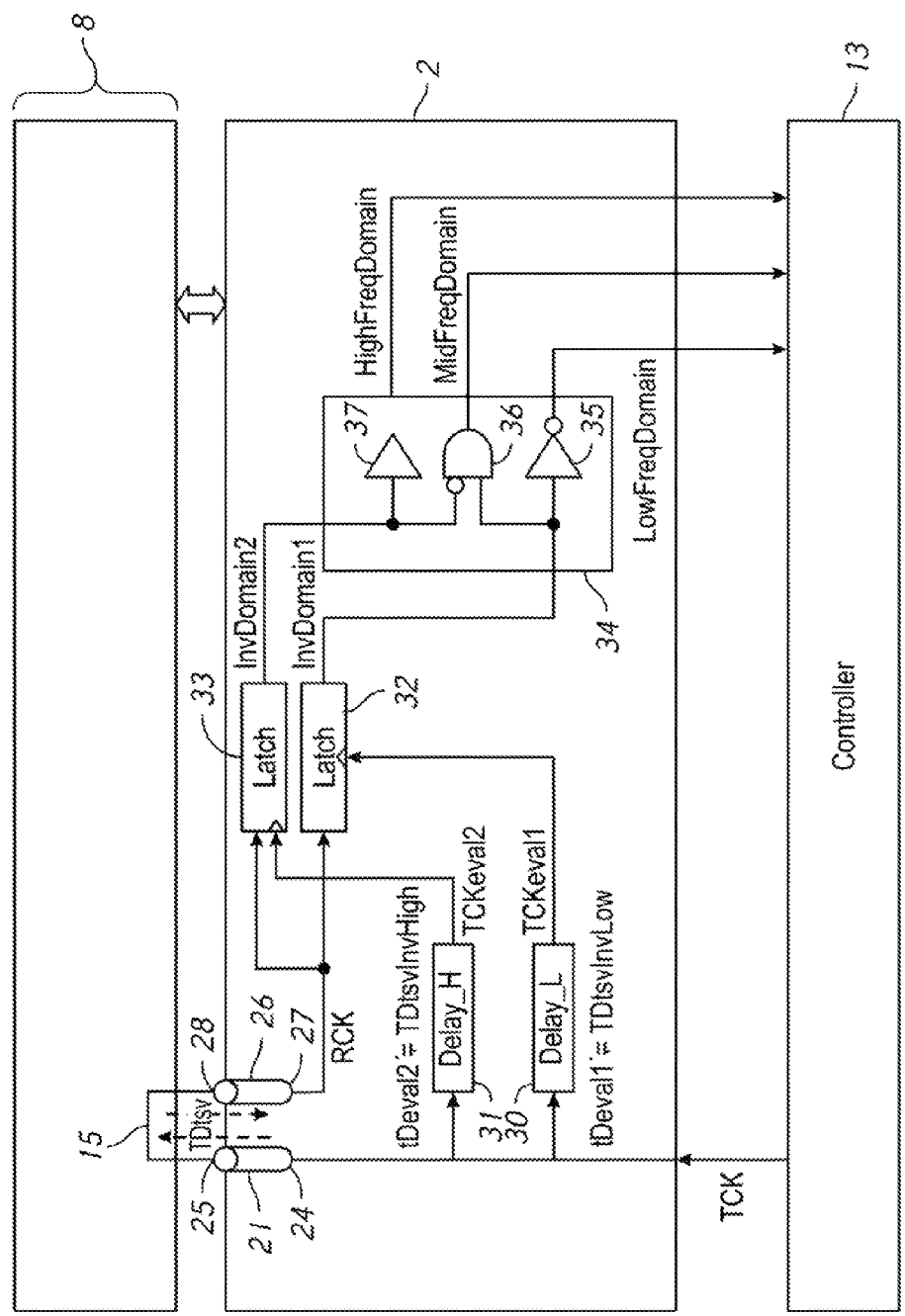
FIG. 5A is a block diagram of an apparatus in a semiconductor device including a conductive via, in accordance with an embodiment of the present disclosure.

FIG. 5A is a block diagram of an apparatus in a semiconductor device including a conductive via in accordance with an embodiment of the present disclosure. Description of components corresponding to components included in FIG. 4A will not be repeated. A delay circuit (Delay_L) 30 for providing a delay corresponding to a first threshold frequency (FREQ1_INV) and a latch circuit 32 corresponding to the delay by the delay circuit (Delay_L) 30 may be provided in the I/F die 2. The combination of the delay circuit 30 and the latch circuit 32 is configured as a comparator for detecting whether a frequency of a first signal is below the first threshold frequency (FREQ1_INV). A delay circuit (Delay_H) 31 for providing a delay corresponding to a second threshold frequency (FREQ2_INV) and a latch circuit 33 corresponding to the delay by the delay circuit (Delay_H) 31 may be provided in the I/F die 2. The combination of the delay circuit 31 and the latch circuit 33 represent a comparator for detecting whether the frequency of the first signal is above the second threshold frequency (FREQ2_INV). The I/F die 2 may further include a logic circuit 34.

Figures 5B, 5C:
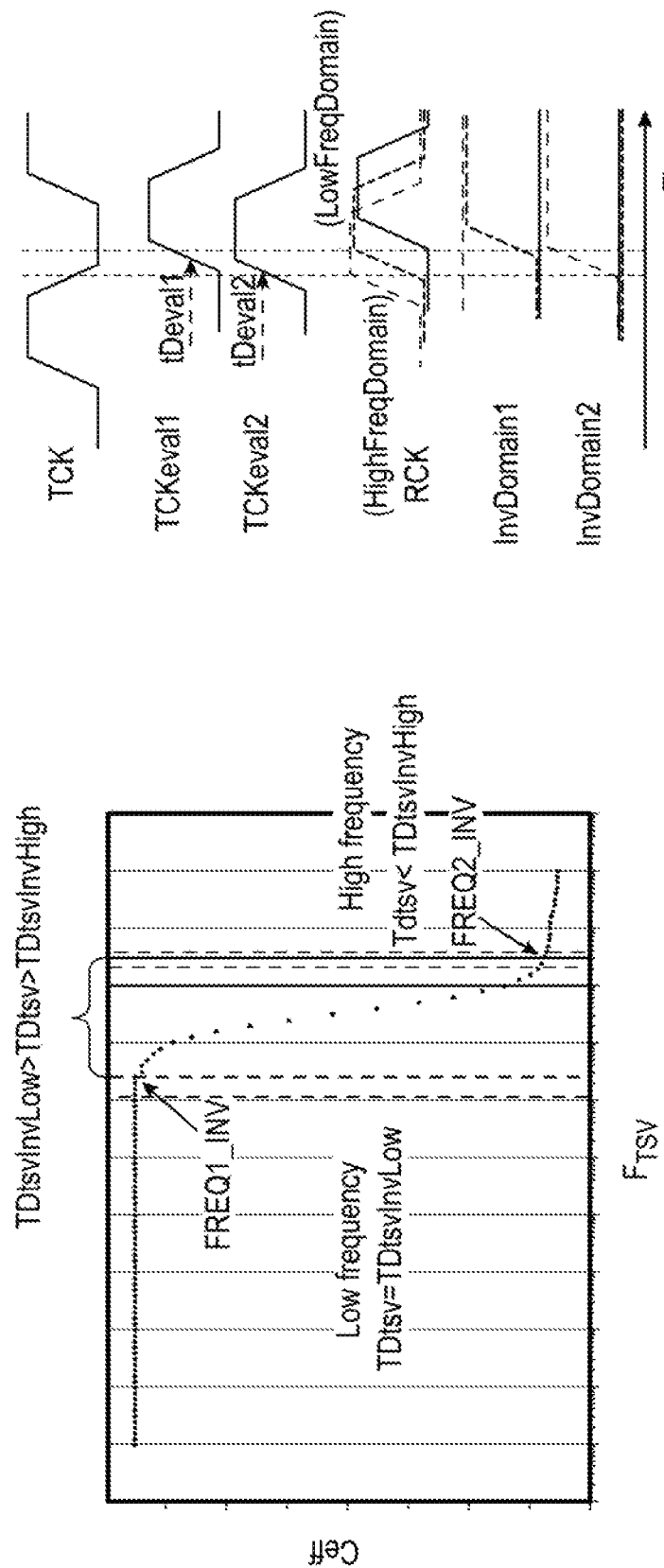
FIG. 5B is a graph showing capacitance-frequency characteristics showing relationships between a frequency of the TSV and effective capacitance of a TSV in an inversion phase, in accordance with an embodiment of the present disclosure.
FIG. 5C is a timing diagram of sets of clock signals, an evaluation reference clock signal and evaluation result signals, in accordance with an embodiment of the present disclosure.

FIG. 5B includes a graph showing capacitance-frequency characteristics showing relationships between a frequency of a signal transmitted by the TSV and effective capacitance of a TSV in an inversion phase, in accordance with an embodiment of the present disclosure. A horizontal axis represents the frequency of the signal transmitted by the TSV ($F_{TSV}$) and a vertical axis represents the effective capacitance of the TSV (Ceff). The delay circuit (Delay_L) 30 receives the first signal (TCK), delays the first signal by an evaluation reference delay (tDeval1) and provides a first delayed signal as an evaluation reference clock signal (TCKeval1). The evaluation reference delay (tDeval1) may be set to a propagation delay (TDtsvInvLow) which may model the effective capacitance (Ceff) of a combination of the conductive via 21 and the conductive via 26 when the first signal has a frequency lower than the first threshold frequency (FREQ1_INV) in an inversion phase. Similarly, the delay circuit (Delay_H) 31 receives the first signal (TCK), delays the first signal by an other evaluation reference delay (tDeval2) and provides a second delayed signal as an evaluation reference clock signal (TCKeval2). The other evaluation reference delay (tDeval2) may be set to a propagation delay (TDtsvInvHigh) which may model the effective capacitance (Ceff) of a combination of the conductive via 21 and the conductive via 26 when the first signal has a frequency higher than the second threshold frequency (FREQ2_INV) in an inversion phase.

The latch circuit 32 latches the third signal (RCK) responsive to an evaluation reference clock signal (TCKeval) and provides an evaluation result signal (InvDomain1) which is indicative of a detected frequency range, such as a domain below the first threshold frequency (FREQ1_INV) or a domain above the first threshold frequency (FREQ1_INV) in the inversion phase as shown in FIG. 5B. The latch circuit 33 latches the third signal (RCK) responsive to the second delayed signal (TCKeval2) and provides an evaluation result signal (InvDomain2) which is indicative of a detected frequency range, such as a domain below the second threshold frequency (FREQ2_INV) or a domain above the second threshold frequency (FREQ2_INV) in the inversion phase as shown in FIG. 5B.

The logic circuit 34 includes an inverter 35, a logic block 36 and a buffer 37. The logic block 36 is shown as an AND logic gate having an inverted input for the evaluation result signal (InvDomain2). However, other logic gates and circuits may be included in the logic circuit 34. The inverter 35 receives the evaluation result signal (InvDomain1), inverts the received signal and provides the inverted signal as a monitor signal (LowFreqDomain). The monitor signal (LowFreqDomain) is indicative of the frequency of the signal transmitted by the TSV ($F_{TSV}$) being in a low frequency range below the first threshold frequency (FREQ1_INV), which causes the third signal (RCK) to have a propagation delay (TDtsv) relative to the first signal (TCK) corresponding to a propagation delay for the low frequency range (TDtsvInvLow). The buffer 37 receives the evaluation result signal (InvDomain2) and provides the signal as a monitor signal (HighFreqDomain). The monitor signal (HighFreqDomain) is indicative of the frequency of the signal transmitted by the TSV ($F_{TSV}$) being in a high frequency range above the second threshold frequency (FREQ2_INV), which causes the third signal (RCK) to have a propagation delay (TDtsv) relative to the first signal (TCK) corresponding to a propagation delay for a high frequency region (TDtsvInvHigh).

The logic block 36 receives the evaluation result signals (InvDomain1 and InvDomain2) after inversion, and provides a monitor signal (MidFreqDomain). The monitor signal (MidFreqDomain) is indicative of the detected frequency range of the frequency of the signal transmitted by the TSV ($F_{TSV}$) being a middle frequency range between the first threshold frequency (FREQ1_INV) and the second threshold frequency (FREQ2_INV). Thus, the third signal (RCK) may have the propagation delay (TDtsv) caused by the first signal (TCK) having a frequency in the middle frequency range, and the propagation delay (TDtsv) may be shorter than the propagation delay of the low frequency range (TDtsvInvLow) and longer than the propagation delay of the high frequency range (TDtsvInvHigh). Thus, a combination of the delay circuits 30 and 31, the latch circuits 32 and 33 and the logic circuit 34 represent an evaluation circuit configured to evaluate the third signal with regards to the first and second delayed signals responsive to the first signal and providing the evaluation result signals.

FIG. 5C is a timing diagram of sets of clock signals (TCK and RCK), evaluation reference clock signals (TCKeval1 and TCKeval2) and evaluation result signals (InvDomain1 and InvDomain2), in accordance with an embodiment of the present disclosure. A horizontal axis represents a time and a vertical axis represents a signal level (e.g., logic high, logic low). Signals based on the first signals in the high frequency range, the middle frequency range and the low frequency range are represented in dotted lines, dashed lines, and solid lines, respectively, for the received clock signal (RCK) and the evaluation result signals (InvDomain1 and InvDomain2). As described above, the evaluation reference clock signal (TCKeval1) has a delay relative to the first signal (TCK) of the evaluation reference delay (tDeval1) representing a propagation delay (TDtsvInvLow) when the first signal (TCK) has the frequency lower than the first threshold frequency (FREQ1_INV) in the inversion phase. The evaluation reference clock signal (TCKeval2) has a delay relative to the first signal (TCK) of the evaluation reference delay (tDeval2) representing a propagation delay (TDtsvInvHigh) when the first signal (TCK) has the frequency higher than the second threshold frequency (FREQ2_INV) in the inversion phase. If the frequency of the signal transmitted by the TSV ($F_{TSV}$) in the low frequency region, the third signal (RCK) has a rising edge after a rising edge of the evaluation reference clock signal (TCKeval1). When the frequency of the signal transmitted by the TSV ($F_{TSV}$) is in the low frequency region, the third signal (RCK) has a rising edge before a rising edge of the evaluation reference clock signal (TCKeval2). When the frequency of the signal transmitted by the TSV (FTSV) in the middle frequency region between the first threshold frequency (FREQ1_INV) and the second threshold frequency (FREQ2_INV), the third signal (RCK) has a rising edge having a delay between the evaluation reference delays (tDeval1 and tDeval2). The latch circuit 32 provides the evaluation result signal (InvDomain1) which is the third signal (RCK) still inactive, for example, at a time the first delayed signal (TCKeval1) latches the third signal (RCK), if the first signal (TCK) has a frequency lower than the first threshold frequency (FREQ1_INV). On the other hand, the propagation delay (TDtsv) of the third signal (RCK) may be shorter than the evaluation reference delay (tDeval1), if the first signal (TCK) has a frequency higher than the first threshold frequency (FREQ1_INV). The propagation delay (TDtsv) of the third signal (RCK) is caused by small effective capacitance (Ceff) of the combination of the conductive via 21 and the conductive via 26. Thus, the latch circuit 32 provides the evaluation result signal (InvDomain1) that is the third signal (RCK) already active, for example, at the time the first delayed signal (TCKeval1) latches the third signal (RCK). The latch circuit 33 provides the evaluation result signal (InvDomain2) which is the third signal (RCK) still inactive, for example, at a time the second delayed signal (TCKeval2) latches the third signal (RCK), if the first signal (TCK) has a frequency higher than the second threshold frequency (FREQ2_INV). On the other hand, the propagation delay (TDtsv) of the third signal (RCK) may be shorter than the evaluation reference delay (tDeval2), if the first signal (TCK) has a frequency higher than the second threshold frequency (FREQ2_INV). The propagation delay (TDtsv) of the third signal (RCK) is caused by small effective capacitance (Ceff) of the combination of the conductive via 21 and the conductive via 26. Thus, the latch circuit 33 provides the evaluation result signal (InvDomain2) that is the third signal (RCK) already active, for example, at the time the second delayed signal (TCKeval2) latches the third signal (RCK). As described above, the logic circuit 34 provides the monitor signals (e.g., LowFreqDomain, MidFreqDomain and HighFreqDomain) responsive to the evaluation result signals (InvDomain1 and InvDomain2) which are outputs of the latch circuits 32 and 33. Thus, it is possible to detect whether the frequency of the clock signal (TCK) is in the high frequency region, the middle frequency region or the low frequency region, and the propagation delay TDtsv can be estimated for further delay compensation.

Figure 6A:
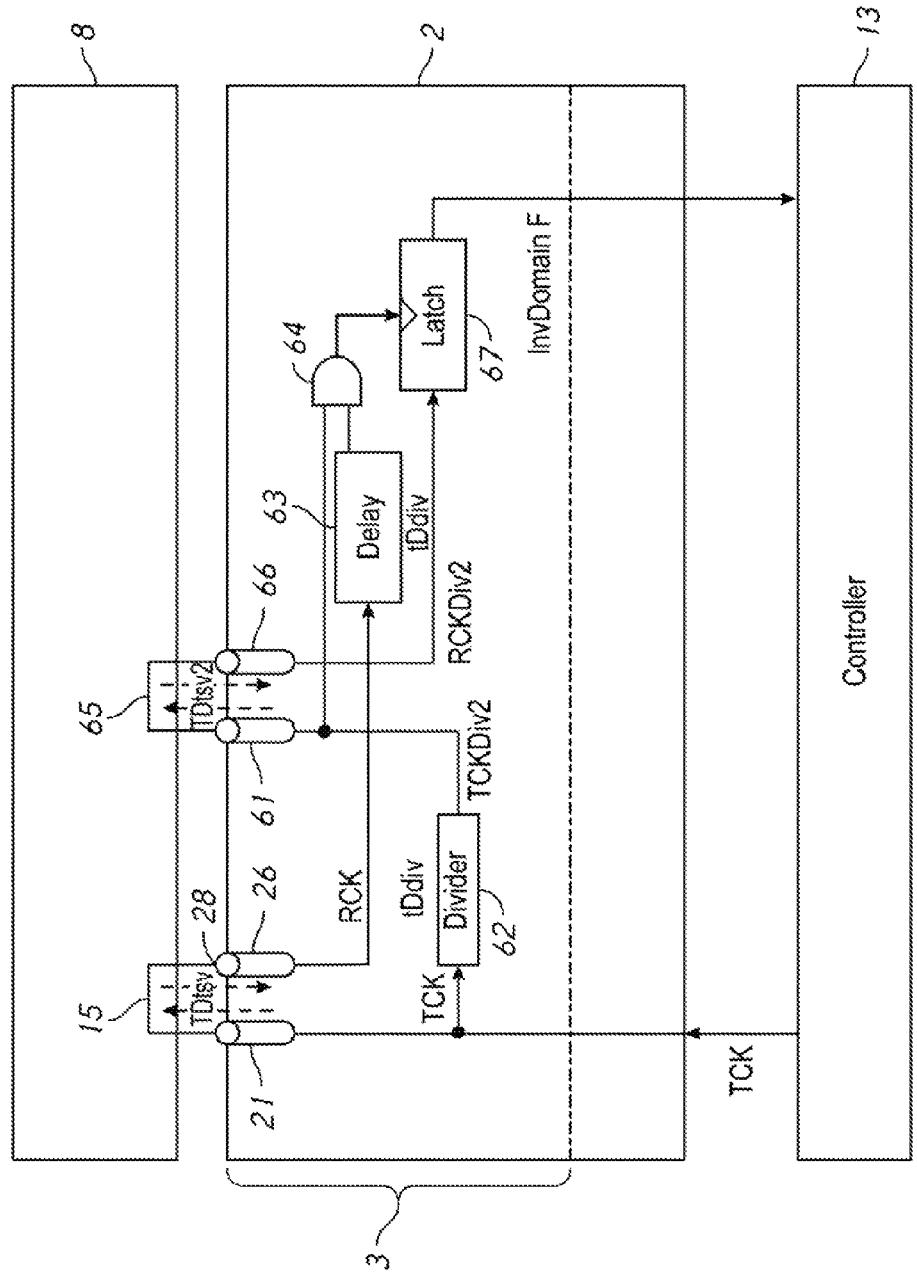
FIG. 6A is a block diagram of an apparatus in a semiconductor device including a conductive via, in accordance with an embodiment of the present disclosure.

FIG. 6A is a block diagram of an apparatus in a semiconductor device including a conductive via in accordance with an embodiment of the present disclosure. Description of components corresponding to components included in FIG. 4A will not be repeated. A divider 62 is provided on the I/F die 2. The divider 62 receives the first signal (TCK) and provides a divided clock signal (TCKDiv2), for example having a half frequency of the first signal (TCK) having a delay of dividing (TDdiv), responsive to the first signal (TCK). A conductive via 61 is provided on the I/F die 2, penetrating the semiconductor substrate 3. The conductive via 61 may receive the divided clock signal (TCKDiv2) and may further provide the divided clock signal (TCKDiv2) further having a propagation delay (TDtsv2) from the I/F die 2 to the at least one core die 8. A conductive via 66 may also be provided on the I/F die 2. The conductive via 66 also penetrates the semiconductor substrate 3. The conductive via 66 is coupled to the conductive via 61 by a wire 65 of the at least one core die 8 and may receive the divided clock signal (TCKDiv2) further having a propagation delay (TDtsv2) from the conductive via 61. The conductive via 66 may provide a divided clock signal for reception (RCKDiv2) that is the divided clock signal (TCKDiv2) further including a propagation delay of the conductive vias 61 and 66 (TDtsv2*2). The third signal (RCK), which is the first signal (TCK) further including a propagation delay of the conductive vias 21 and 26 (TDtsv*2), and the divided clock signal for reception (RCKDiv2) are compared with each other regarding a difference in delay. For fair comparison, a delay circuit 63 provides a delayed third signal including the delay of dividing (TDdiv) on the third signal (RCK). A logic circuit 64 receives an output signal of the delay circuit 63 and the divided first signal (TCKDiv2), and provides an output signal to the latch circuit 67. The latch circuit 67 monitors a phase difference between the output signal of the logic circuit 64 responsive to the third signal (RCK) having the frequency of the first signal (TCK) and the divided clock signal for reception (RCKdiv2) having the half frequency of the first signal, and provides an evaluation result signal (InvDomainF). Thus, two signals of different frequencies (e.g., a clock signal and a command signal) across a boundary of the inversion mode, having one in a low frequency region and the other in a high frequency region may be detected. A combination of the divider 62, the delay circuit 63, the logic circuit 64 and the latch circuit 67 represent an evaluation circuit configured to evaluate the divided clock signal for reception with regards to the third signal and providing the evaluation result signal.

Figure 6C:
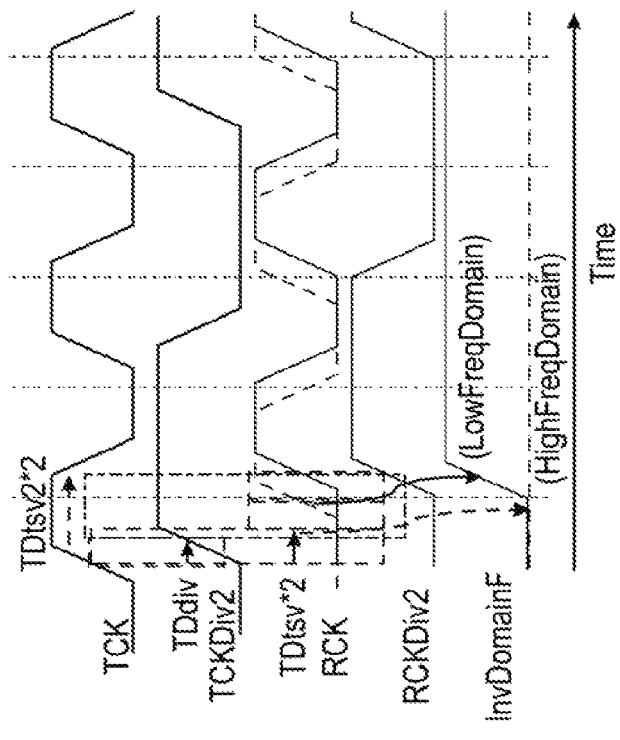
FIG. 6C is a timing diagram of sets of clock signals and an evaluation result signal, in accordance with an embodiment of the present disclosure.
Figure 6B:
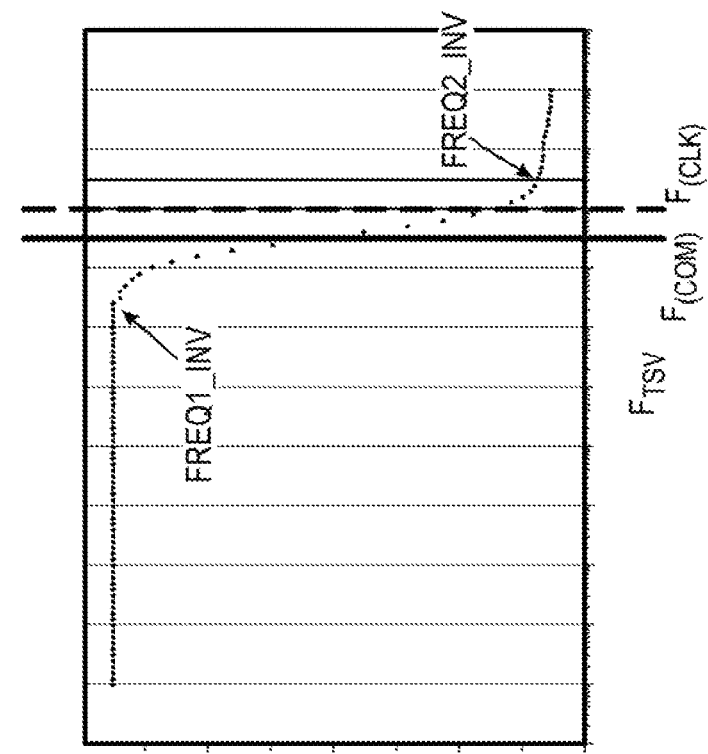
FIG. 6B is a graph showing capacitance-frequency characteristics showing relationships between a frequency of the TSV and effective capacitance of a TSV in an inversion phase, in accordance with an embodiment of the present disclosure.

FIG. 6B includes a graph showing capacitance-frequency characteristics showing relationships between a frequency of a signal transmitted by the TSV ($F_{TSV}$) and effective capacitance of a TSV (Ceff) in an inversion phase, in accordance with an embodiment of the present disclosure. A horizontal axis represents the frequency of the signal transmitted by the TSV ($F_{TSV}$) and a vertical axis represents the effective capacitance of the TSV (Ceff). If a relationship between a frequency of a clock signal (FCLK) and a frequency of a command signal (FCOM) is that the FCOM is substantially lower, approximately a half of the FCLK, an effective capacitance (Ceff) of a conductive via for the command signal may be large due to the low frequency and an effective capacitance (Ceff) of a conductive via for the clock signal may be small due to the high frequency. Thus, a delay caused by the effective capacitance (Ceff) for the command signal may be longer than a delay caused by the effective capacitance (Ceff) for the clock signal, as shown in FIG. 6B.

FIG. 6C shows a timing diagram of sets of the clock signals (TCK and RCK), the divided clock signals (TCKDiv2 and RCKDiv2), and the evaluation result signal (InvDomainF), in accordance with an embodiment of the present disclosure. A horizontal axis represents a time and a vertical axis represents a signal level (e.g., logic high, logic low). Signals based on the first signals in the high frequency range and the low frequency range are represented in dotted lines and solid lines, respectively, for the received clock signal (RCK) and the evaluation result signal (InvDomainF). As described earlier, the divided clock signal (TCKDiv2) may have a half frequency of the first signal (TCK), for example, and may further include a delay of dividing (TDdiv), responsive to the first signal (TCK). The propagation delay (TDtsv*2) of the third signal (RCK) relative to the first signal (TCK) is caused by the effective capacitance (Ceff) of the combination of the conductive via 21 and the conductive via 26. The divided clock signal for reception (RCKDiv2) may have the half frequency of the first signal (TCK), for example. Furthermore, the divided clock signal for reception (RCKDiv2) may include a delay of dividing (TDdiv) responsive to the third signal (RCK). Simultaneously, the divided clock signal for reception (RCKDiv2) may include a propagation delay ($TDtsv_2$*2) of the divided clock signal (TCKDiv2) caused by the effective capacitance (Ceff) of the combination of the conductive via 61 and the conductive via 66. When a frequency of the third signal (RCK) is in a low frequency range and the effective capacitance (Ceff) is large, a rising edge of the third signal (RCK) has the propagation delay (TDtsv*2) which is longer than the delay of a rising edge of the divided clock signal for reception (RCKDiv2). Thus, an output signal of the latch circuit 67 (InvDomainF) provided by latching the divided clock signal for reception (RCKDiv2) by the third signal (RCK) is set to a logic high level. On the other hand, the rising edge of the third signal (RCK) has the propagation delay (TDtsv*2) which is shorter than the delay of the rising edge of the divided clock signal for reception (RCKDiv2), when the frequency of the third signal (RCK) is in a high frequency range and the effective capacitance (Ceff) is small. Thus, the output signal of the latch circuit 67 (InvDomainF) provided by latching the divided clock signal for reception (RCKDiv2) by the third signal (RCK) is set to a logic low level. Therefore, the output signal of the latch circuit 67 (InvDomainF) is indicative of the frequency range, either high or low, of the third signal (RCK). In this manner, a signal having a clock frequency in the high frequency region and a signal having a half frequency in the low frequency region may be detected. It should be noted that a frequency divided by two used as a latch signal in the embodiment of FIG. 6C is merely an example. A signal having a frequency which is a frequency of a reference clock signal divided by any natural number may be used as a latch signal for detecting a delay due to effective capacitance (Ceff) of a TSV.

Figure 6D:
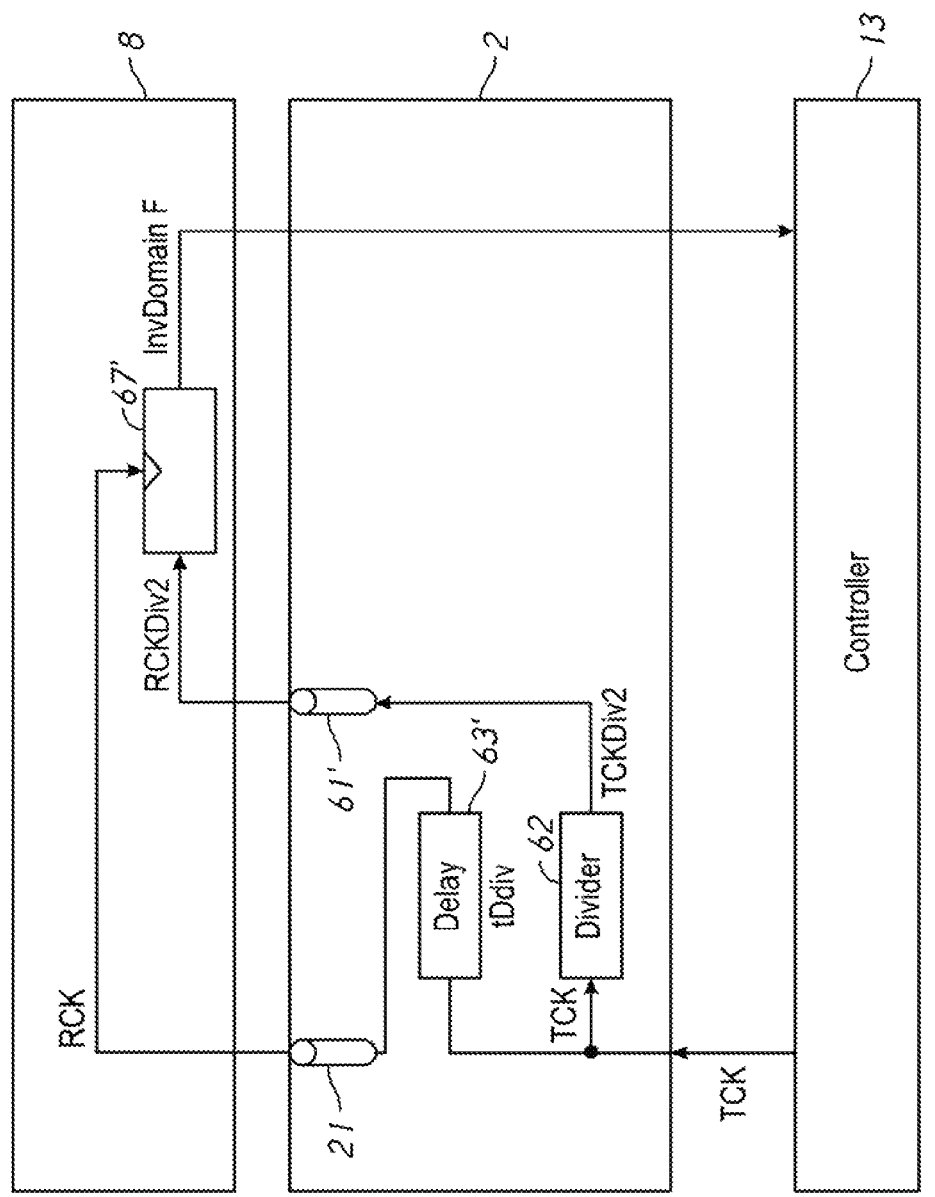
FIG. 6D is a block diagram of an apparatus in a semiconductor device including a conductive via, in accordance with an embodiment of the present disclosure.

Detecting delays due to effective capacitance (Ceff) of a TSV by monitoring signals, such as a clock signal having a reference clock frequency and another signal having a divided reference clock frequency may be implemented by an apparatus in the core die without an additional TSV returning a signal back to the I/F die. FIG. 6D is a block diagram of an apparatus in a semiconductor device including a conductive via, in accordance with an embodiment of the present disclosure.

The semiconductor device may include an interface (I/F) die 2 and at least one core die 8. A conductive via 21 for transmitting a signal is provided on the I/F die 2. The conductive via 21 may receive a first signal from a controller 13. The first signal may be a clock signal (TCK) for signal transmission through the conductive via 21. The conductive via 21 may then provide a second signal (RCK). Thus, the conductive via 21 may transmit a signal (e.g., a clock signal) from the I/F die 2 to the at least one core die 8. A divider 62 is provided on the I/F die 2. The divider 62 receives the first signal (TCK) and provides a divided clock signal (TCK-Div2), for example having a half frequency of the first signal (TCK) having a delay of dividing (TDdiv), responsive to the first signal (TCK). A conductive via 61' is provided on the I/F die 2. The conductive via 61' may receive the divided clock signal (TCKDiv2) and may further provide the divided clock signal (RCKDiv2) further having a propagation delay (TDtsv2) from the I/F die 2 to the at least one core die 8. The third signal (RCK), which is the first signal (TCK) further including a propagation delay of the conductive via 21 (TDtsv), and the divided clock signal for reception (RCKDiv2) are compared with each other regarding a difference in delay. A latch circuit 67' receives the third signal (RCK) and the divided clock signal for reception (RCKDiv2), latches the divided clock signal for reception (RCKdiv2) by the third signal (RCK) and provides an evaluation result signal (InvDomainF). Thus, two signals of different frequencies (e.g., a clock signal and a command signal) across a boundary of the inversion mode, having one in a low frequency region and the other in a high frequency region may be detected without sending the third signal back to the I/F die 2. The latch circuit 67' represents an evaluation circuit configured to evaluate the divided clock signal for reception with regards to the third signal and providing the evaluation result signal.

Figure 7A:
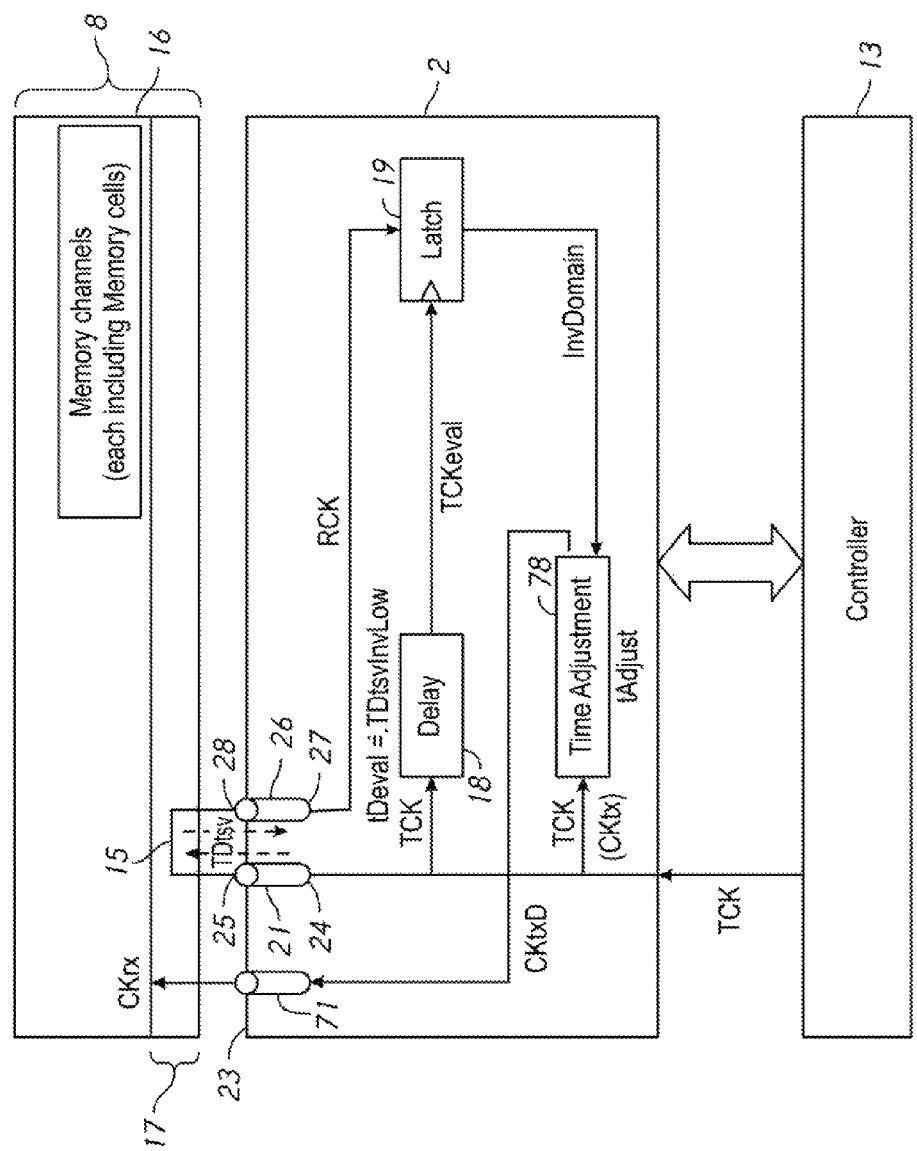
FIG. 7A is a block diagram of an apparatus in a semiconductor device including a conductive via, in accordance with an embodiment of the present disclosure.

FIG. 7A is a block diagram of an apparatus in a semiconductor device including a conductive via in accordance with an embodiment of the present disclosure. Description of components corresponding to components included in FIG. 4A will not be repeated. The semiconductor device may further include a time adjustment circuit 78 that receives a first signal (CKtx) that may be a clock signal (TCK). Responsive to the first signal and an evaluation result signal (InvDomain) from the latch circuit 19, the time adjustment circuit 78 adjusts timings of the first signal (CKtx) by an adjustment delay (tAdjust) and provides a first adjusted delay signal (CKtxD) as an adjustment clock signal to a conductive via 71. The conductive via 71 receives the first adjusted delay signal (CKtxD) and further delays with a propagation delay of the conductive via 71. Thus, the at least one core die 8 receives a received first signal (CKrx) that includes the adjustment delay (tAdjust) and the propagation delay of the conductive via 71 relative to the first signal (CKtx). In this example, the time adjustment circuit 78 is a delay circuit. However, any time adjustment circuit may be used for the time adjustment circuit 78.

As stated above, an evaluation result signal, such as InvDomain, showing whether the clock signal is in a high frequency region or a low frequency region, may be used for determining if adjustment of a phase of the clock signal (TCK, CKtx) in view of an other signal also transmitted on another conductive via is to be executed. Alternatively, it is possible to use another evaluation result signal, such as InvDomainF, showing two signals of different frequencies the vicinity of a boundary region between the high frequency region and the low frequency region, as an input signal for timing adjustment of the clock signal (TCK, CKtx). Thus, a time adjustment circuit 78 may provide adjustment for a delay between the clock signal and the other signal due to signal frequency dependency of conductive vias in accordance with changes in frequencies of the clock signal and the other signal.

Figure 7B:
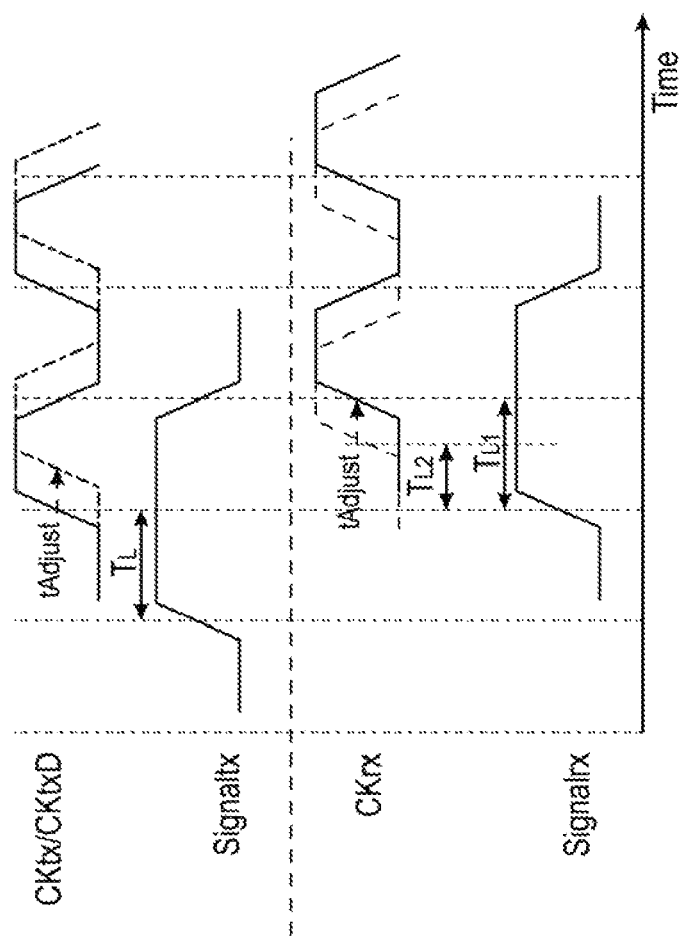
FIG. 7B is a timing diagram of sets of a clock signal and another signal at a transmitter side and a receiver side, in accordance with an embodiment of the present disclosure.

FIG. 7B is a timing diagram of sets of a clock signal and an other signal at a transmitter side and a receiver side, in accordance with an embodiment of the present disclosure. A horizontal axis represents a time and a vertical axis represents a signal level (e.g., logic high, logic low). The received clock signals (CKrx) based on the first signals in the high frequency range and low frequency range are represented in dotted lines and solid lines, respectively. A clock signal with an adjustment delay (tAdjust) at a transmission side (CKtxD) is represented by a dashed line. For example, a rising edge of the clock signal at the transmitter side (CKtx) rises about a lag time ($T_{L1}$) after a rising edge of the other signal at the transmitter side (Signaltx). Responsive to the clock signal (CKtx) and the other signal (Signaltx), the clock signal at the receiver side (CKrx) and the other signal at the receiver side (Signalrx) are received. Because of the clock signal having a high frequency and the other signal having a low frequency, the clock signal and the other signal add different delays at conductive vias. Due to the different delays at the conductive vias, a lag time ($T_{L2}$) between a rising edge of the other signal received (Signalrx) and a rising edge of the clock signal (CKrx) becomes shorter than the lag time ($T_{L1}$). Thus, the adjustment delay (tAdjust) may be added to provide the clock signal with the adjustment delay (tAdjust) at the transmitter side (CKtxD) for further delay compensation of the received clock signal (CKrx), in order to avoid a phase error of having the lag time at the receiver side different from the lag time at the transmitter side due to signal frequency dependency of the conductive vias.

Figure 8A:
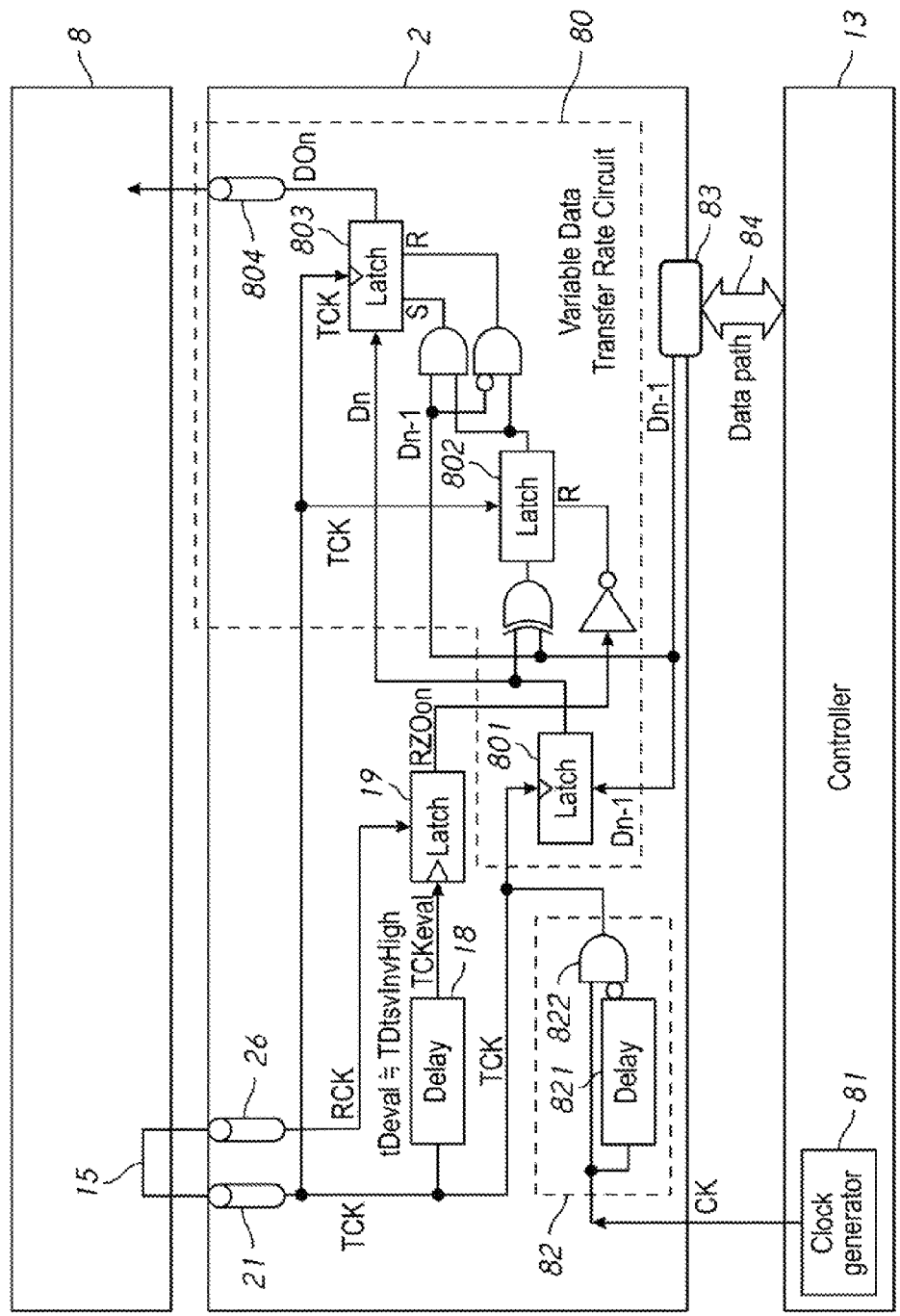
FIG. 8A is a block diagram of an apparatus in a semiconductor device including a conductive via and a variable data transfer rate circuit, in accordance with an embodiment of the present disclosure.
Figure 8B:
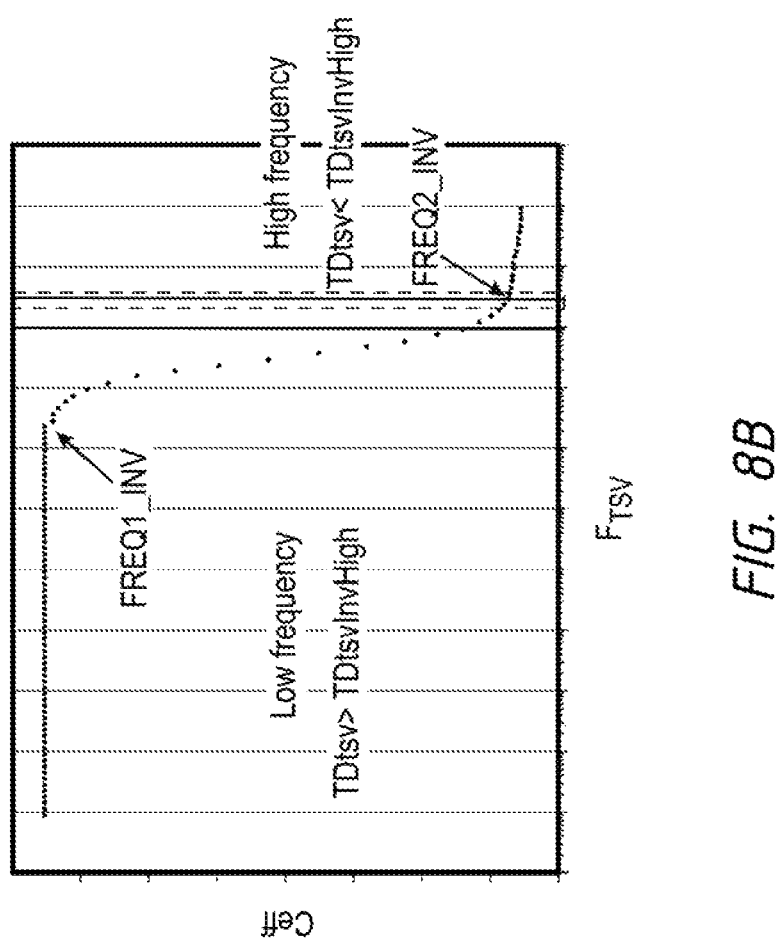
FIG. 8B is a graph showing capacitance-frequency characteristics showing relationships between a frequency of the TSV and effective capacitance of a TSV in an inversion phase, in accordance with an embodiment of the present disclosure.

Techniques described above for timing adjustment of signals based on frequencies of the signals may be applied for accommodating changes in a data transfer rate while using similar conductive vias. FIG. 8A is a block diagram of an apparatus in a semiconductor device including a conductive via and a variable data transfer rate circuit, in accordance with an embodiment of the present disclosure. Description of components corresponding to components included in FIG. 4A will not be repeated. For example, a clock generator 81 in a controller 13 provides a clock signal (CK) to a pulse generator 82 in an I/F die 2. The pulse generator 82 may include a delay circuit 821 and a logic gate 822. The delay circuit 821 provides a delay (tDtrs) corresponding to a time for transferring a clock signal through a conductive via 21. The pulse generator 82 provides a transmitter clock signal (TCK) to a conductive via 21, a delay circuit 18, a latch circuit 19 and a variable data transfer rate circuit 80. A first circuit including the delay circuit 18 and the latch circuit 19 may represent an evaluation circuit. The delay circuit 18 provides an evaluation reference clock signal (TCKeval) including an evaluation reference delay (tDeval). The evaluation reference delay (tDeval) may be set to a propagation delay (TDtsvInvHigh) when the transmitter clock signal (TCK) has a frequency higher than the second threshold frequency (FREQ2_INV) in an inversion phase. The propagation delay (TDtsvInvHigh) is caused by the effective capacitance (Ceff) of a combination of the conductive via 21 and a conductive via 26. A clock signal received (RCK) from a core die 8 via a conductive via 26 is provided at the latch circuit 19. FIG. 8B is a graph showing capacitance-frequency characteristics showing relationships between a frequency of the TSV and effective capacitance of a TSV in an inversion phase, in accordance with an embodiment of the present disclosure. The latch circuit 19 latches the clock signal received (RCK) responsive to the evaluation reference clock signal (TCKeval) and provides an evaluation result signal (RZ0on) which is indicative of a detected frequency range, such as a low frequency range below the second threshold frequency (FREQ2_INV) or a high frequency range above the second threshold frequency (FREQ2_INV) in the inversion phase as shown in FIG. 8B. If the transmitter clock signal (TCK) provided by the pulse generator 82 is in the high frequency region, the evaluation result signal (RZ0on) may be set to a logic high level.

FIG. 8A includes an example of the variable data transfer rate circuit 80. The variable data transfer rate circuit 80 may receive a data signal (Dn-1) transmitted from the controller 13 via a data path 84 through a data terminal 83. The variable data transfer rate circuit 80 includes a latch circuit 801 which latches the data signal (Dn-1) responsive to the transmitter clock signal (TCK) and provides a data signal (Dn). The data signals (Dn-1 and Dn) are provided to a latch circuit 802 through a logic gate (e.g., an exclusive OR gate) and a signal indicative of a change between the data signals (Dn-1 and Dn) is provided from the logic gate. The latch circuit 802 latches the signal indicative of the change between the data signals (Dn-1 and Dn) by the transmitter clock signal (TCK). The latch circuit 802 receives an inverted signal of the evaluation result signal (RZ0on) as a reset signal. Logic gates receives the data signal (Dn-1) and the output signal from the latch circuit 802 and provides signals to an S input and an R input of a latch circuit 803. The latch circuit 803 latches the data signal (Dn) and by the transmitter clock signal (TCK), and a data output signal (DOn) may be provided to a conductive via 804 for transmission to the core die 8. Thus the variable data transfer rate circuit 80 receives the evaluation result signal (RZ0on) as a control signal and adjusts a duty cycle of the data signal responsive to the evaluation result signal (RZ0on).

Figure 8C:
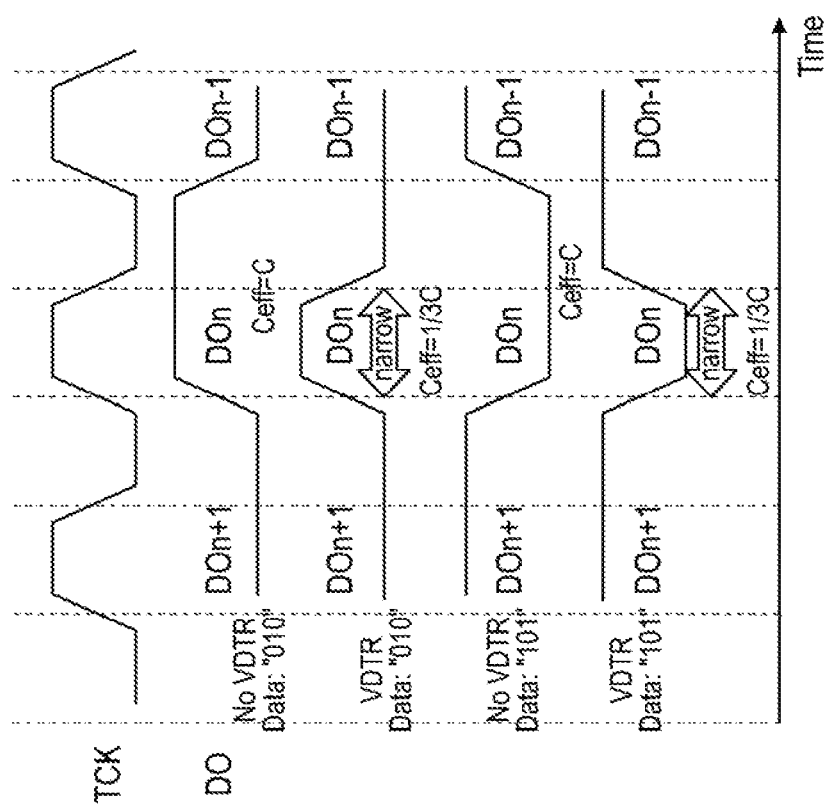
FIG. 8C is a timing diagram of a clock signal and data signals, in accordance with an embodiment of the present disclosure.

FIG. 8C is a timing diagram of a clock signal and data signals, in accordance with an embodiment of the present disclosure. When a data sequence of three bits includes a number of transitions (e.g., "010", "101"), transitions of logic levels of a data signal occurs at every rising edge of the transmitter clock signal (TCK), and the data signal may have a lower frequency than a frequency of the transmitter clock signal (TCK). Due to the lower frequency of the data signal, the data signal may have a longer delay due to effective capacitance (Ceff) of a conductive via compared to a delay the transmitter clock signal (TCK) may have due to effective capacitance (Ceff) of a conductive via. By controlling the duty cycle of the data signal by the variable data transfer rate circuit 80 of FIG. 8A, a period of "1" in a data sequence "010" or a period of "0" in a data sequence may be controlled to be shorter such as a half cycle (½TCK) of a cycle of the transmitter clock signal (TCK). The duty cycle control of the data signal places the frequency of the data signal through the conductive via in a high frequency range. Thus, the delay caused by the effective capacitance (Ceff) of the conductive via may be maintained at the substantially same level between the transmitter clock signal (TCK) and the data signal. Furthermore, reduction of the effective capacitance (Ceff) may lower power consumption caused by charging or discharging during data transmission through a conductive via.

Logic levels of signals used in the embodiments described the above are merely examples. However, in other embodiments, combinations of the logic levels of signals other than those specifically described in the present disclosure may be used without departing from the scope of the present disclosure.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications, and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

What is claimed is:

1. An apparatus comprising a semiconductor chip, the semiconductor chip comprising:
    a first conductive via penetrating a semiconductor substrate that has a first main surface and a second main surface thereof and including a first end on a side of the first main surface and a second end on a side of the second main surface, the first conductive via being configured to receive a first signal at the first end, and further being configured to provide a second signal from the second end; and
    a second conductive via penetrating the semiconductor substrate and including a third end on the side of the first main surface and a fourth end on the side of the second main surface, the second conductive via being configured to provide a third signal from the third end, and further configured to receive a fourth signal corresponding to the second signal at the fourth end.

2. The apparatus as claimed in claim 1, further comprising:

a delay circuit configured to delay the first signal and further configured to provide a first delayed signal; and a latch circuit configured to latch the third signal responsive to the first delayed signal.

3. The apparatus as claimed in claim 1, further comprising:
a first delay circuit configured to delay the first signal and further configured to provide a first delayed signal;
a first latch circuit configured to latch the third signal responsive to the first delayed signal;
a second delay circuit configured to delay the first signal and further configured to provide a second delayed signal;
a second latch circuit configured to latch the third signal responsive to the second delayed signal; and
a logic circuit configured to produce a monitor signal responsive to output signals of the first and second latch circuits.

4. The apparatus as claimed in claim 1, further comprising;
a divider configured to provide a divided clock signal responsive to the first signal; and
a third conductive via penetrating the semiconductor substrate and configured to receive the divided clock signal.

5. The apparatus of claim 4, further comprising:
a fourth conductive via penetrating the semiconductor substrate and configured to receive the divided clock signal from the third conductive via at one end and provide the divided clock signal at another end responsive to the received divided clock signal at the one end; and
a latch circuit configured to latch the divided clock signal for reception by the third signal.

6. The apparatus of claim 1, further comprising a time adjustment circuit configured to receive the first signal and the evaluation result signal, and further configured to provide an adjustment clock signal.

7. The apparatus as claimed in claim 1, further comprising:
a first circuit configured to produce a control signal responsive to the third signal;
a first terminal configured to receive a data signal;
a logic circuit configured to adjust a duty cycle of the data signal responsive to the control signal.

8. An apparatus comprising:
a controller configured to provide a clock signal as a first signal;
a first conductive via configured provide a second signal responsive to the first signal;
a second conductive via coupled to the first conductive via and configured to provide a third signal responsive to the second signal; and
an evaluation circuit configured to provide an evaluation result signal responsive to the third signal, wherein the evaluation result signal is indicative of a frequency of the clock signal and is based on a delay of the third signal relative to the clock signal.

9. The apparatus of claim 8, further comprising an interface die, wherein the interface die includes the first conductive via, the second conductive via and the evaluation circuit.

10. The apparatus of claim 8, wherein an evaluation circuit comprises:
a delay circuit configured to receive the first signal and to delay the first signal based on a propagation delay related to effective capacitance of the first conductive via with a first threshold frequency, the delay circuit further configured to provide a first delayed signal; and
a latch circuit configured to latch the third signal responsive to the first delayed signal.

11. The apparatus of claim 8, wherein the evaluation circuit comprises:
a first comparator configured to detect whether a frequency of the first signal is below a first threshold frequency, and further configured to provide a first evaluation result signal;
a second comparator configured to detect whether the frequency of the first signal is above a second threshold frequency that is higher than the first threshold frequency, and further configured to provide a second evaluation result signal; and
a logic circuit configured to receive the first evaluation result signal and the second evaluation result signal, and further configured to provide a signal indicative of whether the frequency of the first signal is in a low frequency region below the first threshold frequency, in a middle frequency region between the first threshold frequency and the second threshold frequency or in a high frequency region above the second threshold frequency.

12. The apparatus of claim 11, wherein the first comparator comprises:
a first delay circuit configured to delay the first signal based on a first propagation delay related to effective capacitance of the first conductive via with a first threshold frequency, and further configured to provide a first delayed signal; and
a first latch circuit configured to latch the third signal responsive to the first delayed signal, and
wherein the second comparator comprises:
a second delay circuit configured to delay the first signal based on a second propagation delay related to effective capacitance of the first conductive via with a second threshold frequency, and further configured to provide a second delayed signal; and
a second latch circuit configured to latch the third signal responsive to the second delayed signal.

13. The apparatus of claim 8, wherein the evaluation circuit further comprises a divider configured to provide a divided clock signal responsive to the first signal, and the apparatus further comprises:
a third conductive via configured to receive the divided clock signal,
wherein the evaluation circuit is configured to provide the evaluation result signal based on the divided clock signal and the third signal.

14. The apparatus of claim 13, further comprising:
a fourth conductive via configured to receive a signal from the third conductive via and further configured to provide the divided clock signal,
wherein the evaluation circuit further including a latch circuit configured to latch the divided clock signal responsive to the third signal and the divided clock signal.

15. The apparatus of claim 8, further comprising:
a time adjustment circuit configured to receive the first signal and the evaluation result signal, and further configured to provide an adjustment clock signal.

16. The apparatus of claim 8, further comprising:
a first terminal configured to receive a data signal from the controller;

a variable data transfer rate circuit configured to receive the evaluation result signal and further configured to adjust a duty cycle of the data signal responsive to the evaluation result signal.

17. The apparatus of claim 16, wherein the evaluation circuit is configured to provide the evaluation result signal responsive to the third signal by detecting whether a frequency of the third signal is higher than a second threshold frequency.

18. The apparatus of claim 16, further comprising a pulse generator,
wherein the controller includes a clock generator configured to provide the clock signal, and
wherein the pulse generator is configured to provide a transmitter clock signal to the first conductive via and the variable data transfer rate circuit is responsive to the clock signal.

19. An apparatus comprising:
a controller configured to provide a clock signal;
an interface die comprising:
  a first conductive via configured to receive the clock signal as a first signal and further configured to provide a second signal;
  a divider configured to provide a divided clock signal responsive to the first signal; and
  a second conductive via configured to receive the divided clock signal and further configured to provide a divided clock signal; and
a core die comprising:
  an evaluation circuit configured to provide an evaluation result signal responsive to the divided clock signal and the second signal.

20. The apparatus of claim 19 wherein the evaluation circuit comprises a latch circuit configured to latch the divided clock signal for reception responsive to the second signal.

* * * * *